United States Patent [19]

Theus

[11] Patent Number: 4,904,968
[45] Date of Patent: Feb. 27, 1990

[54] CIRCUIT BOARD CONFIGURATION FOR REDUCING SIGNAL DISTORTION

[75] Inventor: John G. Theus, Sherwood, Oreg.

[73] Assignee: Tektronix, Inc., Beaverton, Oreg.

[21] Appl. No.: 334,827

[22] Filed: Apr. 7, 1989

[51] Int. Cl.$^4$ ............................................. H01P 5/00
[52] U.S. Cl. .................................. 333/246; 333/247; 174/250; 439/92
[58] Field of Search ................ 333/246, 247; 361/413, 361/414; 439/55, 59, 92, 95

[56] References Cited

U.S. PATENT DOCUMENTS

4,100,516  7/1978  Hall .
4,751,613  6/1988  Werdin et al. .................. 361/414 X
4,788,766  12/1988  Burger et al. .......................... 29/830

Primary Examiner—Paul Gensler
Attorney, Agent, or Firm—John P. Dellett; Robert S. Hulse

[57] ABSTRACT

A circuit board configuration for I/O devices and logic devices, wherein the I/O devices have current levels substantially higher than the current levels associated with the logic devices. The I/O devices are grouped adjacent a connector, and a ground return plane surrounds the I/O devices coupling the ground terminals of the I/O devices to the ground pins of the connector. The logic devices are spaced some distance away from the connector where the ground terminals of the logic devices are connected through vias to a ground plane. The ground return plane, forming a strip line with the ground, plane, is effective for isolating the I/O devices and reducing signal distortion on the board.

11 Claims, 7 Drawing Sheets

CIRCUIT BOARD CONFIGURATION FOR REDUCING SIGNAL DISTORTION

BACKGROUND OF THE INVENTION

The present invention relates to a circuit board wherein devices having current levels substantially higher than other devices are isolated to reduce signal distortion.

In a computer, a backplane comprises a computer bus for transmitting signals between circuit boards coupled to the backplane by connectors and a backplane ground for diverting ground currents on the individual circuit boards to an external ground. The individual circuit boards typically comprise I/O devices, and logic devices configured to perform some function on the signals on the bus, e.g. a video board, a processor board, or an I/O board. The signals sent to the I/O devices from the bus have current levels substantially higher than the current levels associated with logic devices on the board.

In very high speed bus systems, these relatively high currents flowing between the I/O devices and the backplane through the connector may induce enough distortion in the signal currents on the board to render the board inoperable. The distortion may be caused by crosstalk between the ground currents of the I/O devices and the signal currents in the logic circuitry, and by noise generated in the signal traces connecting the I/O devices to the connector as a result of inductance in the signal traces or a characteristic impedance mismatch. Therefore, the I/O devices are physically and electrically isolated from the logic devices to reduce signal distortion caused by crosstalk and noise in the signal traces.

Generally, the I/O devices are connected through signal traces in such a manner that current loops formed by the signal terminal and ground terminal on the I/O devices in contact with the signal and ground pins on the connector have a short path length and a minimal amount of inductance. Additionally, the ground currents of the I/O devices are desirably returned directly to the ground pins on the connector whereas the ground terminals of the logic devices connect through the board to a ground plane on the bottom of the board which is in electrical contact with the ground pins of the connector.

Figure 1:
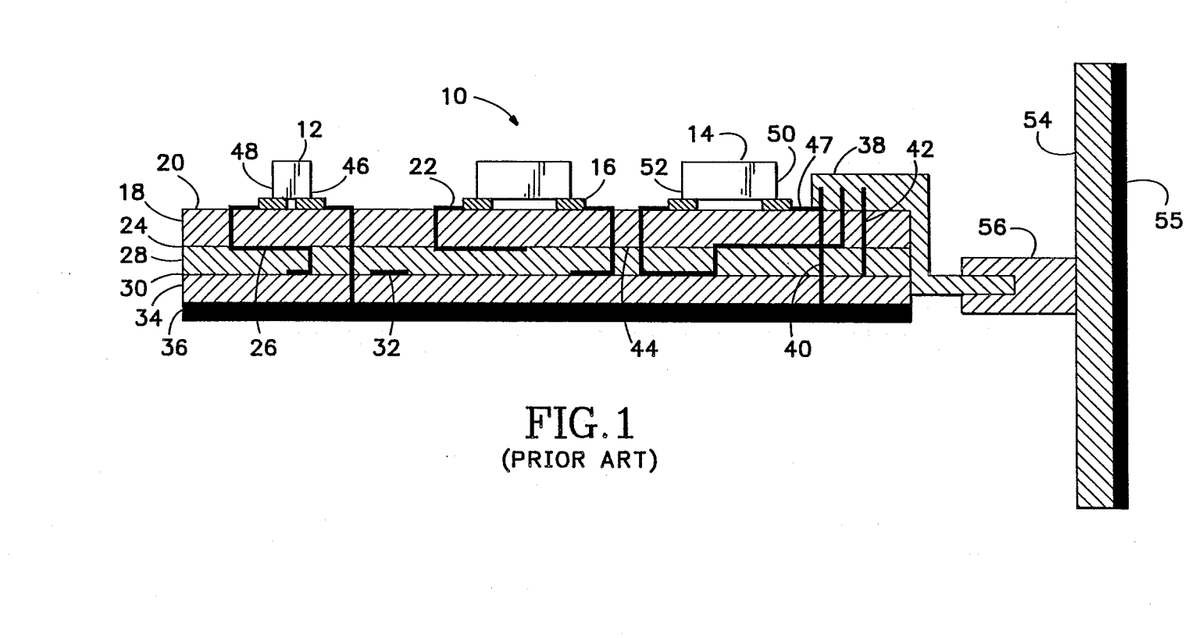
FIG. 1 is a vertical cross-section of a prior art circuit board.

In a typical circuit board 10, as shown in FIG. 1, a number of surface mounted devices including logic devices 12 having ground terminals 46 and signal terminals 48, and input/output (I/O) devices 14 having ground terminals 50 and signal terminals 52, are surface mounted on pads 16 disposed on insulating board 18. The logic devices receive signals from the I/O devices, process the signals, and send them back to the I/O devices, while the I/O devices interact with the logic devices, and send and receive signals from off the circuit board, e.g. from the computer bus. The current levels of the signals passed between the I/O devices and the computer bus are substantially higher than the current levels involving the logic devices. A signal plane 20 on the surface of insulating board 18 includes mounting pads 16 and signal traces 22 connected to the device terminal through the pads.

A signal plane 24 comprising signal traces 26 running parallel to each other lies below insulating board 18, separated by a layer of insulation 28 from a signal plane 30 also comprising signal traces 32 running parallel to each other but perpendicular to signal traces 26. An insulating board 34 is disposed below signal plane 30, the latter being provided with a copper ground plane 36 formed on its bottom surface.

Male connector 38 having ground pins 40 and signal pins 42 is mounted on the surface of insulating board 18, wherein ground pins 40 extend through the insulating boards and contact the ground plane 36, while signal pins 42 extend through the insulating boards and contact signal traces 26 and 32. A plurality of vias 44 are routed through the insulating boards connecting the signal traces 22, 26 and 32 to each other, and connecting the ground terminals of the logic devices to the ground plane. Signal traces 47 in signal plane 20 couple the ground terminals of the I/O devices to the ground pins 40 of connector 38.

The circuit board 10 is typically constructed by forming a layer of copper on the bottom of insulating board 34 to create ground plane 36, depositing a layer of metal on the top surface of insulating board 34, and etching the metal to define signal plane 30. Further layers of metal are deposited on the top and bottom surfaces of insulating board 18 and are etched to provide signal planes 20 and 24 respectively. Particular masks employed to etch signal planes 30, 24 and 20 determine the layout of the I/O and logic devices as well as the signal traces connecting the ground terminals of the I/O devices to the ground pins of connector 38. The two insulating boards 18 and 34 are joined by means of insulating layer 28 separating signal planes 24 and 30 with the vias 44 being formed by boring holes through the various insulating boards and filling the holes with metal.

A backplane 54, having a bus 57 (not shown in FIG. 1) and a backplane ground 55, receives circuit board 10 by coupling male connector 38 on the circuit board to a female connector 56 on the backplane. The connectors convey signals between the bus and the I/O devices on the board, and direct the ground current of the I/O and logic devices to the backplane ground in turn connected to external ground.

Figure 2:
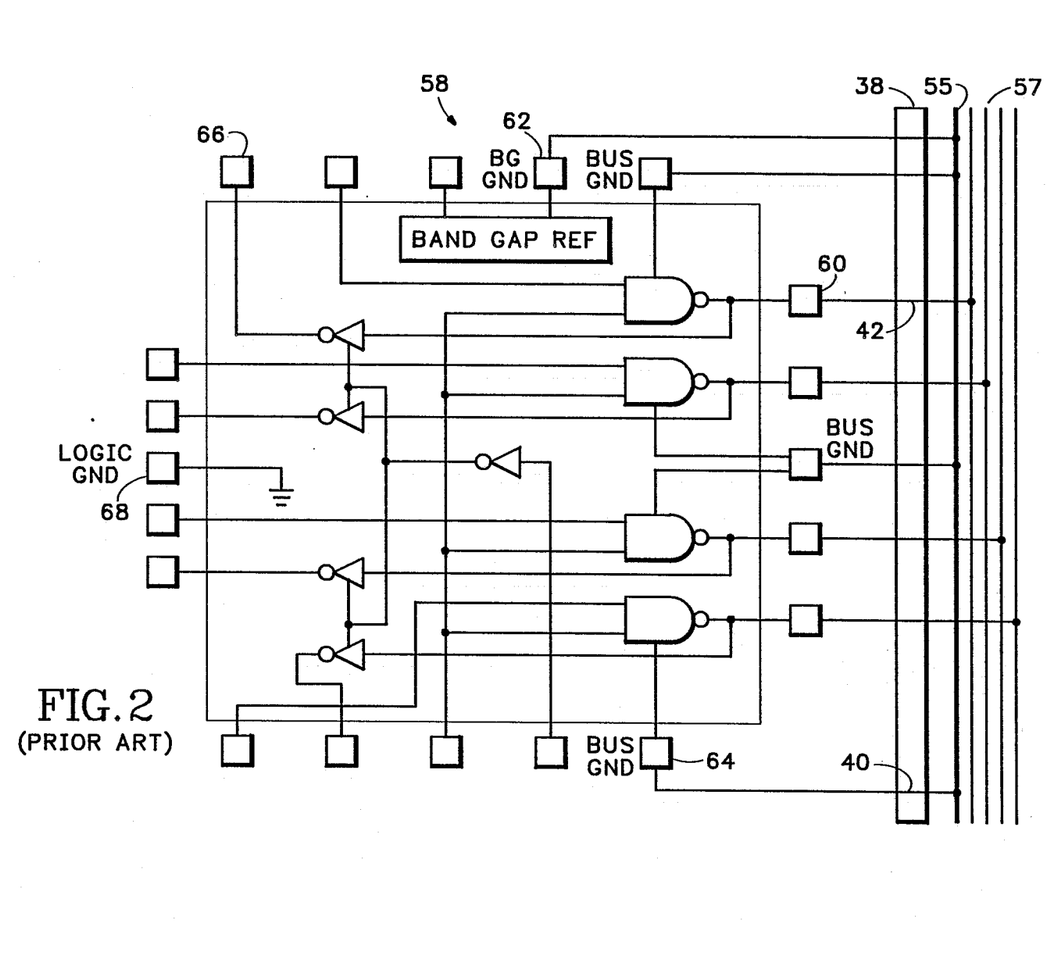
FIG. 2 is a schematic diagram of a typical I/O device.

The I/O devices may comprise devices such as a turbotransceiver 58, designed for use in very high speed bus systems and shown schematically in FIG. 2. The turbotransceiver has signal pins 66 that communicate with the logic devices, a logic ground 68 connected to the ground plane 36 through one of the vias 44, I/O signal terminals 60 each being connected through one of the signal pins 42 to the bus 57, and a band gap ground terminal 62 as well as three bus ground terminals 64 connected through pins 40 to backplane ground 55. The currents between the connector 38 and terminals 60, 62, and 64 of the turbotransceiver are substantially higher in level than the currents in the logic devices and may induce enough distortion in the signal currents to render the circuit board inoperable. To reduce the distortion in the signals, the ground current from the I/O devices is physically and electrically isolated from the ground current in the logic devices, while the signal traces joining the ground terminals to the ground pins of the connector are configured to reduce the inductance in the current loop and the noise induced in the signals.

One method for isolating the I/O devices from the rest of the circuit employs a copper strip conductor formed around the edge of the top surface of insulating board 18, with the I/O devices spaced along the board adjacent the strip. The ground terminals of the devices are connected to the strip which is in contact with the ground pin of the connector, while the ground terminals of the logic devices are connected to ground plane 36 in contact with the ground pin of the connector.

Figure 3:
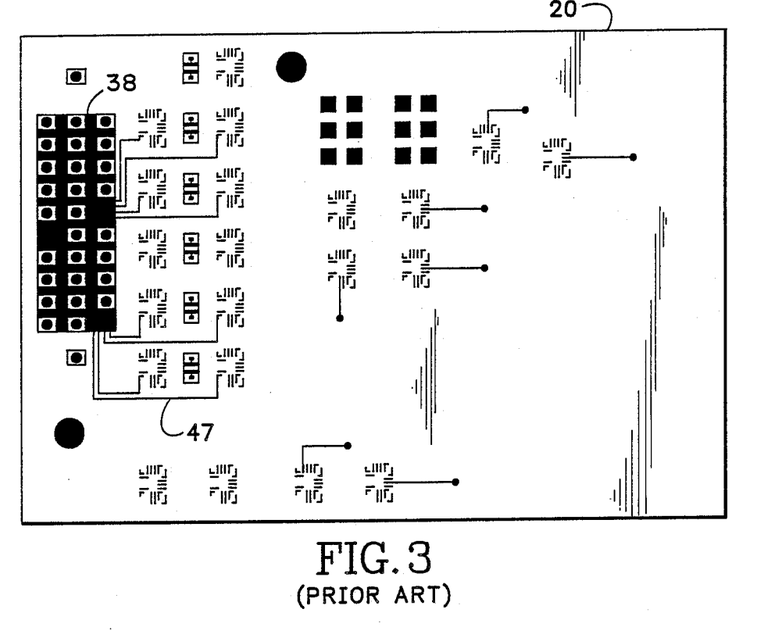
FIG. 3 is a top view of a typical circuit board showing connections between the I/O devices and a connector.

FIG. 3 illustrates a known design for signal plane 20 of circuit board 10 connecting the ground terminals of the turbotransceivers to the ground pins of the connector. Turbotransceivers are grouped directly adjacent connector 38 such that the path length of a signal trace 47 connecting the ground terminal of the turbotransceiver to the nearest ground pin of connector 38 is as short as possible for reducing trace inductance. The ground pin is blackend out to show the connection between the ground pin and signal trace 47. Each of the ground terminals has its own signal trace 47 to minimize noise.

Referring to FIGS. 1 and 3, the aforementioned design creates a transmission line environment by locating signal traces 26 and 32 both above the ground plane 36. The signal traces and the ground plane form a transmission line that has a given characteristic impedance allowing a constant impedance to be established between the connector and the I/O devices for matching the impedance of the backplane and the connector. This constant impedance match is important in order to reduce noise in the signal traces as would be caused by an impedance mismatch. The value of the impedance is determined according to the distances between the ground plane and the signal traces, the width and height of the signal traces, and the dielectric constants of the insulating boards. It is kept constant by maintaining these factors.

Loop currents are developed by current flowing in through signal pins 42, through the signal traces, up the vias to the signal terminals of the turbotransceiver for example, through the transceiver circuitry, out the ground terminal through traces 47, and back to the ground pins on the connector. Currents flowing in these loops establish electro-magnetic fields that induce crosstalk in nearby signal leads thereby causing distortion. Returning the ground terminal of the I/O device to the ground pin nearest the associated signal pin reduces the path-length and the area of the current loop and the particular construction of the signal trace may reduce trace inductance.

However, the effectiveness of the above method for isolating I/O devices, such as the turbotransceiver, can be limited by the pin-to-pin connections of the ground terminals of the I/O devices to the ground pins of the connector, and by the transmission line environment. For high speed bus signals, the separate signal traces may not provide suitable electrical properties such as resistance, capacitance and specifically minimum inductance for effectively connecting the I/O devices to the connector without causing distortion. Also, as shown in FIG. 3, when several I/O devices are grouped adjacent the connector, routing the traces between the terminals and the ground pins for maintaining a low inductance path may be difficult. Furthermore, the transmission line environment created on the board in the area of the high current I/O devices tends to reinforce the electro-magnetic fields established by the high current loops that cause crosstalk and signal distortion.

SUMMARY OF THE INVENTION

In a circuit board according to an embodiment of the present invention, having I/O devices, logic devices, and a connector, wherein the I/O devices have current levels substantially higher than the current levels of the logic devices, the I/O devices are grouped adjacent the connector and a ground return plane is formed on the surface of the board surrounding the I/O devices connecting the ground terminals of the I/O devices to the connector.

It is accordingly an object of the invention to provide an improved circuit board for reducing signal distortion characteristics.

It is another object of the invention to provide an improved circuit board that isolates ground current from devices having current levels substantially higher than other devices from such other devices.

It is also an object of the invention to provide an improved circuit board that reduces circuit crosstalk.

The subject matter of the present invention is particularly pointed out and distinctly claimed in the concluding portion of the specification. However, both the organization and method of operation of the invention, together with further advantages and objects thereof, may best be understood by reference to the following description taken in connection with the accompanying drawings wherein like reference characters refer to like elements.

DETAILED DESCRIPTION

The present invention relates to circuit boards wherein I/O devices having current levels substantially higher than logic devices on the board are isolated to reduce signal distortion.

As noted, in high speed bus systems it is important to create a path between the ground terminals of high current I/O devices and the connector that has low resistance and inductance to reduce the noise in the path, and to establish an electrical environment that reduces the crosstalk between the I/O current and current in logic devices. According to the present invention, the I/O devices are grouped directly adjacent the connector, while a ground return plane is formed surrounding the I/O devices and connecting their ground terminals to the ground pins of the connector. This ground return plane establishes a low resistance, low inductance path between the ground terminals and the nearest ground pin. Furthermore, the ground return plane creates a strip line environment for the I/O signals which effectively cancels the components of the electro-magnetic fields resulting from loop currents that might cause crosstalk between the high current signals and the logic devices.

Figure 4:
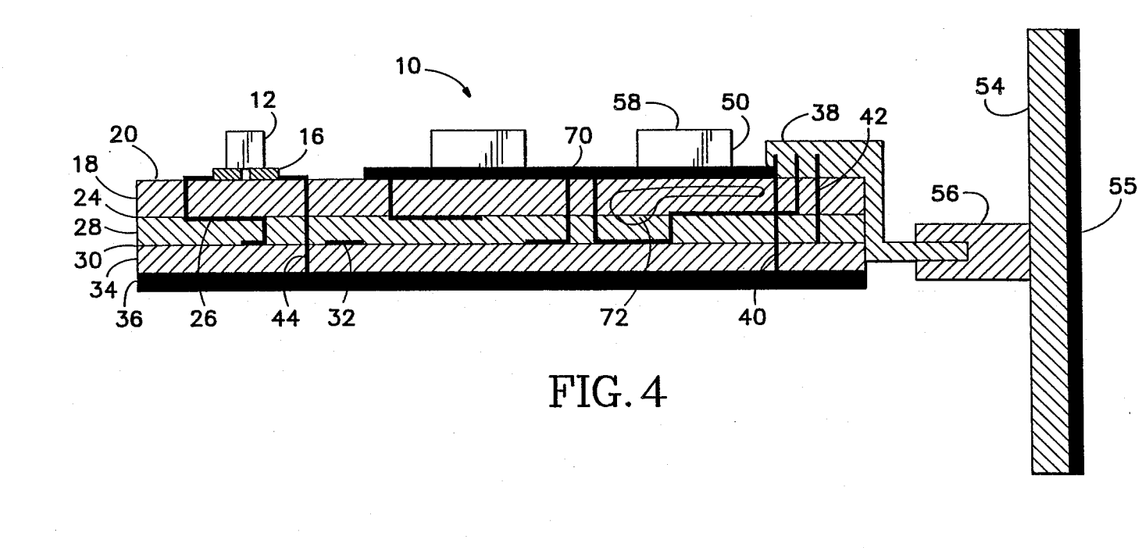
FIG. 4 is a vertical cross-section of a circuit board embodying the present invention.

FIG. 4 is a cross-sectional view of circuit board 10 in accordance with the invention. The I/O devices, e.g. turbotransceivers 58, are grouped directly adjacent connector 38 while logic devices 12 are arranged on the board at a distance from connector 38 and the I/O devices. Signal plane 20 on the surface of insulating board 18 includes a ground return plane 70 surrounding the I/O devices and directly electrically connected to the ground terminals 50 of the I/O devices. The ground return plane is connected to the ground pins of connector 38. The ground return plane provides a low resistance, low inductance path for the ground currents of the I/O devices which are mixed with the ground current from the logic devices routed through ground plane 36 and sent to the backplane ground 55.

Furthermore, the ground return plane 70 together with the ground plane 36 establish a strip line environment around signal traces 26 and 32 that lie between the two planes. A current loop 72 creates electro-magnetic fields that would cause crosstalk. However, the homogeneous environment provided by the strip line cancels the components of the electro-magnetic field associated with the inductive and capacitive characteristics of the signal traces for reducing crosstalk between the high current I/O devices and the logic devices.

FIGS. 5a–5e comprise top views of circuit board 10, the signal planes 20, 24, and 30, and ground plane 36. The darkened portions of FIGS. 5b–5e indicate the regions where metal is deposited to form the mounting pads 16, vias 44, signal traces 22, 26, 32, and 47, connector pins 40 and 42, ground plane 36, and ground return plane 70.

Figure 5A:
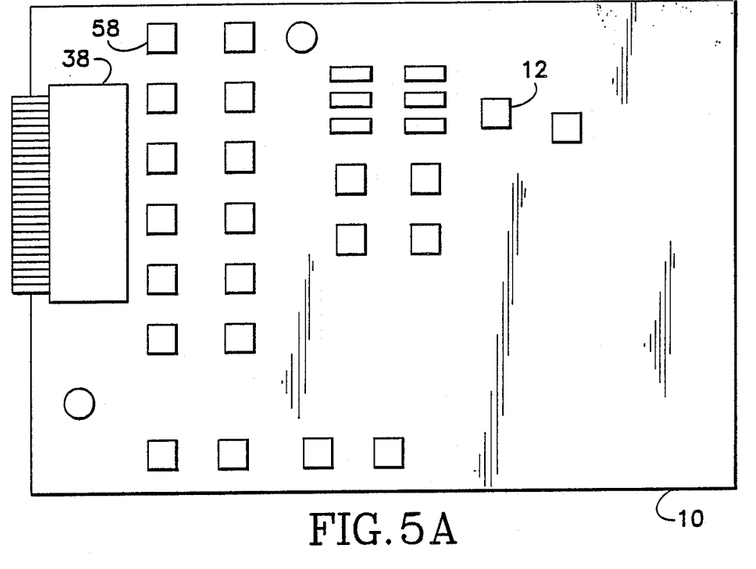
FIGS. 5a–5e are top views of the circuit board, signal planes, and ground plane according to the present invention.

FIG. 5a illustrates a plurality of I/O devices, e.g. turbotransceivers 58, grouped around connector 38, and a number of logic devices 12 spaced about the circuit board away from turbotransceivers 58 and connector 38. In the preferred embodiment, the computer bus is a high speed bus referred to as the IEEE 896 Futurebus and therefore connector 38 is a Futurebus connector. The connector conveys signals from the bus to the I/O devices which send signals to the logic devices 12 and receive signals back from the logic devices which are sent to the bus through the connector. The ground currents for the I/O devices and the logic devices are separated until they reach the connector where they are added and directed to the backplane ground.

Figure 5B:
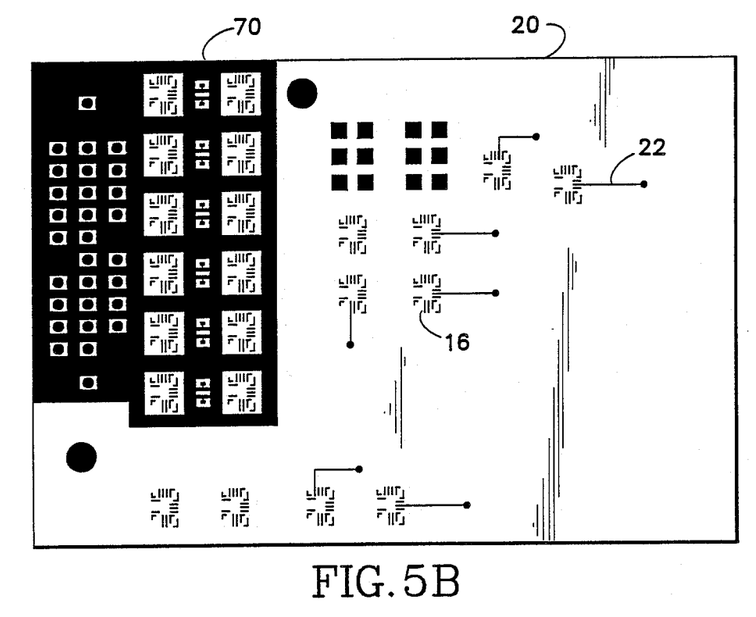

FIG. 5b shows the layout of signal plane 20 comprising surface mounting pads 16, signal traces 22, the ground pins and signal pins of the connector, and ground return plane 70. The positions of the ground pins in the connector are blackened out illustrating the connection between the ground pins and ground return plane 70. The I/O ground currents are not constrained to follow a specific signal trace to a chosen ground pin but may follow a path of least resistance through ground return plane 70 to the nearest ground pin. Therefore, the noise caused by the path is reduced, and the inductive and capacitive components of the electro-magnetic field that induce crosstalk are diminished.

Figure 5C:
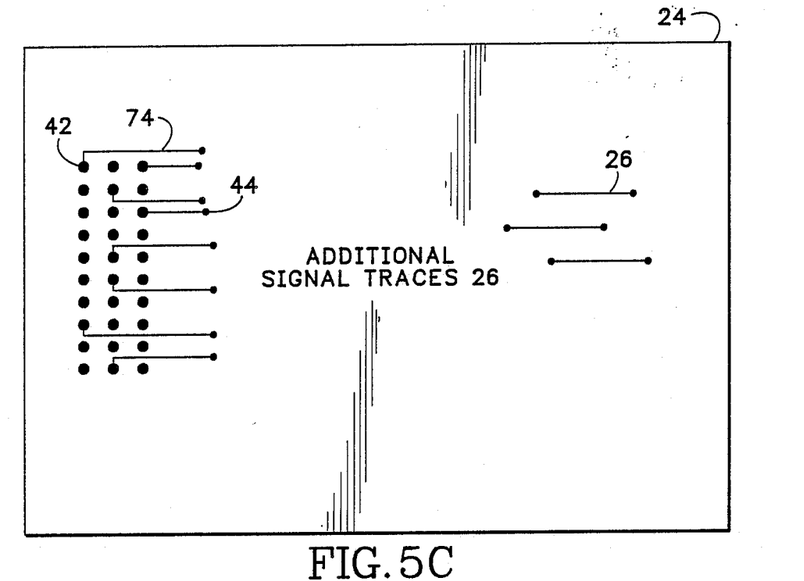

FIG. 5c illustrates the layout of signal plane 24 comprising connector signal pins 42, signal traces 26, and traces 74. Traces 74 from the connector pins extend horizontally to signal traces 26 outside the region of the connector. The signal traces 26 run parallel to each other in a horizontal direction between the vias 44 that interconnect the signal traces in the respective signal planes.

Figure 5D:
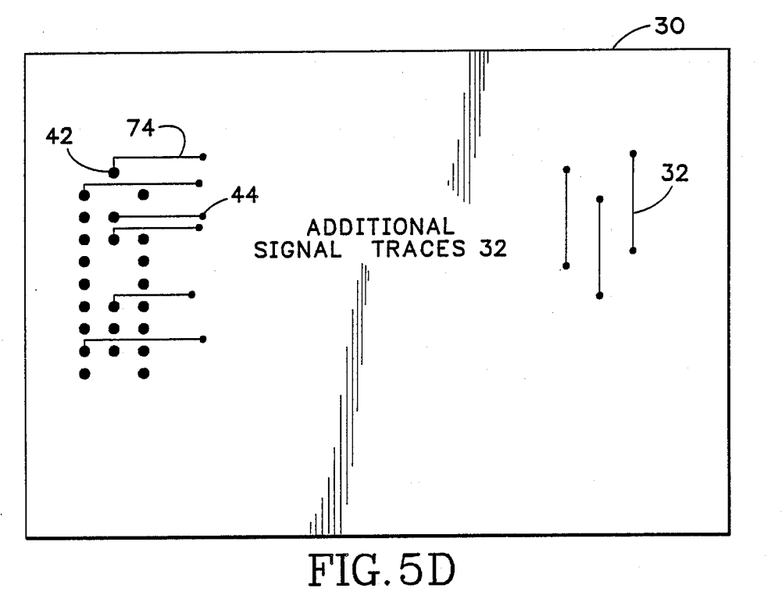

FIG. 5d depicts the layout of a signal plane 30 comprising connector signal pins 42, signal traces 32, and traces 74. Traces 74 from the connector pins extend horizontally to signal traces outside the region of the connector. Once outside the connector region, the signal traces 32 run parallel to each other between vias 44 in a direction perpendicular to signal traces 26. The two signal planes 24 and 30 having signal traces perpendicular to each other facilitates making the proper connections between the terminals of the devices and maintaining an environment that does not create additional distortion.

Figure 5E:
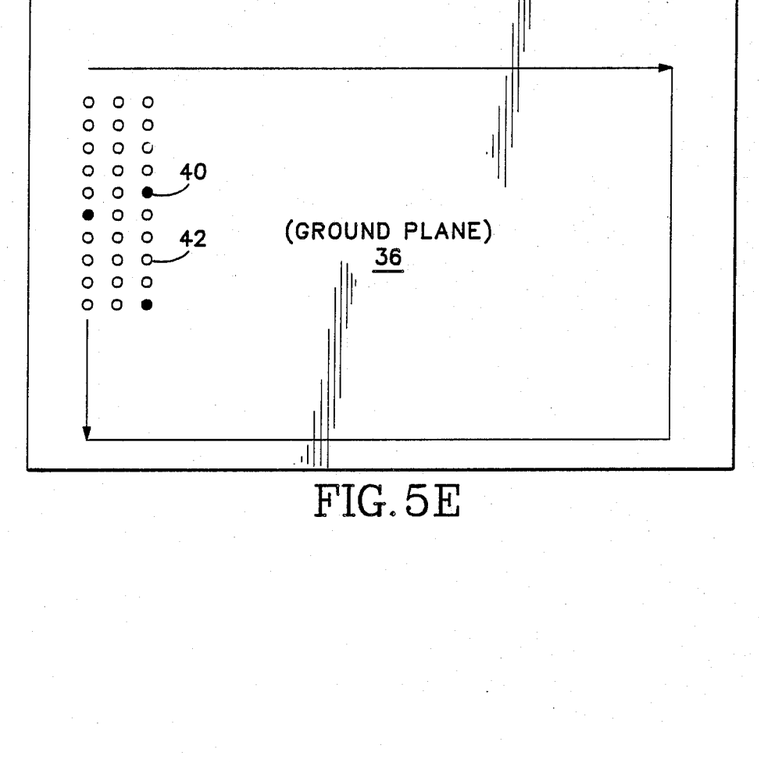

FIG. 5e shows the layout of ground plane 36. Ground pins 40 electrically connect ground plane 36 to connector 38. The light spaces indicate the positions of signal pins 42 of connector 38 that do not extend through the insulating boards to electrically contact ground plane 36. The ground plane is a layer of copper that covers the bottom surface of insulating board 34. The ground terminals of the logic devices are connected by vias 44 through the board to the ground plane, and the ground current flows through the board to the ground pin and out the connector to the backplane ground.

Referring to FIGS. 4 and 5a–5e, ground return plane 70 isolates the ground current of the I/O devices and creates a strip-line environment for the I/O signal currents, and therfore reduces signal distortion by providing a path of least resistance between the I/O devices and the connector, while reducing the inductance and capacitance associated with the high current loops and creating a homogeneous environment that diminishes crosstalk.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A circuit board comprising:
   a signal plane having a plurality of signal traces,
   a first insulating layer above said signal plane,
   a connector having a ground pin and a signal pin, the signal pin connecting to one of the signal traces,
   a first device adjacent said connector, said first device having a ground terminal and a signal terminal,
   means for connecting the signal terminal through said first insulating layer to one of the signal traces, and
   a ground return plane on the surface of said first insulating layer which surrounds said first device and electrically connects the ground terminal of said first device to the ground pin of said connector.

2. The circuit board as recited in claim 1 further comprising:
   a second insulating layer below said signal plane,
   a ground plane below said second insulating layer forming a strip line with said ground return plane,
   a second device mounted on said first insulating layer a current level substantially less than said first device and having a ground terminal and a signal terminal, and
   means for respectively connecting the last mentioned ground terminal and signal terminal through insulating layers to said ground plane and signal traces.

3. The circuit board as recited in claim 2 wherein said first device is an input/output device, and said second device is a logic device, in further combination with a backplane, the backplane including a ground and a bus, said connector and the backplane being coupled such that said connector conveys input signals from the bus to the circuit board, output signals from the circuit board to the bus, and ground currents to the backplane ground.

4. The circuit board as recited in claim 2 wherein said first device is a transceiver having a first ground terminal for ground current associated with signals sent between the transceiver and said second device, and a second ground terminal associated with signals sent between the transceiver and said connector.

5. The circuit board as recited in claim 2 further comprising another signal plane on the surface of said first insulating layer, and wherein said first and second devices are surface mounted devices.

6. A circuit board comprising:
   a ground plane,
   a first insulating layer above said ground plane,
   a signal plane above said first insulating layer having a plurality of signal traces,
   a second insulating layer above said signal plane,
   a plurality of circuit devices mounted on the surface of said second insulating layer having a plurality of ground terminals and a plurality of signal terminals,
   means for connecting said ground terminals through said insulating layers to said ground plane, and said signal terminals through at least one of said insulating layers to the signal traces,
   a connector mounted on said second insulating layer having a ground pin connected to said ground plane and a signal pin connected to one of the signal traces,
   a plurality of input/output devices mounted on the surface of said second insulating layer adjacent said connector having current levels substantially higher than said circuit devices, and having a plurality of ground terminals and a plurality of signal terminals,
   means for connecting the last mentioned signal terminals through at least one of said insulating layers to the signal traces, and
   a ground return plane on the surface of said second insulating layer immediately surrounding said input/output devices and electrically connecting the ground terminals of said input/output devices to the ground pin of said connector, said ground return plane and said ground plane forming a strip line.

7. The circuit board as recited in claim 6 further comprising:
   another insulating layer above said signal plane, and
   a second signal plane above the last mentioned insulating layer having a plurality of signal traces.

8. The circuit board as recited in claim 6 in further combination with a backplane, the backplane including a ground and a bus, said connector and the backplane being coupled such that said connector conveys input signals from the bus to the circuit board, output signals are sent from the circuit board to the bus, and ground current is coupled to the backplane ground.

9. The circuit board as recited in claim 6 wherein said input/output devices are transceivers, each having a first ground terminal for ground current associated with signals sent between the transceiver and said circuit devices, and a second ground terminal associated with signals sent between the transceiver and said connector.

10. The circuit board as recited in claim 6 further comprising another signal plane on the surface of said second insulating layer, and wherein said circuit devices and input/output devices are surface mounted.

11. A circuit board comprising:
   a ground plane,
   a first insulating layer above said ground plane,
   a signal plane above said first insulating layer having a plurality of signal traces,
   a second insulating layer above said signal plane,
   a second signal plane above said second insulating layer also having a plurality of signal traces,
   a third insulating layer above said second signal plane,
   a third signal plane on the surface of said third insulating layer including a plurality of pads, and a ground return plane, said ground return plane and said ground plane forming a strip line,
   a connector mounted on the surface of said third insulating layer having a ground pin connected through a said insulating layer to said ground plane and a signal pin connected to one of the signal traces,
   a plurality of surface mounted logic devices mounted on ones of said pads distant from said connector, each having a ground terminal and a signal terminal,
   means for connecting the last mentioned ground terminal through a said insulating layer to said ground plane and the last mentioned signal terminal through a said insulating layer to one of the signal traces,
   a plurality of surface mounted input/output devices mounted on ones of said pads adjacent said connector, said input/output devices having current levels substantially higher than said logic devices, and each having a ground terminal and a signal terminal, and
   means for connecting the last mentioned signal terminal through a said insulating layer to one of the signal traces,
   wherein said ground return plane surrounds said input/output devices in substantially the same plane therewith and electrically connects the ground terminals of said input/output devices to the ground pin of said connector.

* * * * *